US006956770B2

(12) United States Patent
Khalid et al.

(10) Patent No.: US 6,956,770 B2
(45) Date of Patent: Oct. 18, 2005

(54) NON-VOLATILE MEMORY AND METHOD WITH BIT LINE COMPENSATION DEPENDENT ON NEIGHBORING OPERATING MODES

(75) Inventors: Shahzad Khalid, West Los Angeles, CA (US); Yan Li, Milpitas, CA (US); Raul-Adrian Cernea, Santa Clara, CA (US); Mehrdad Mofidi, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 146 days.

(21) Appl. No.: 10/667,223

(22) Filed: Sep. 17, 2003

(65) Prior Publication Data

US 2005/0057967 A1 Mar. 17, 2005

(51) Int. Cl.[7] ............................................... G11C 16/04
(52) U.S. Cl. ............................ 365/185.12; 365/185.17; 365/185.22
(58) Field of Search ....................... 365/185.11, 185.12, 365/185.17, 185.22

(56) References Cited

U.S. PATENT DOCUMENTS

| | | |
|---|---|---|
| 5,172,338 A | 12/1992 | Mehrotra et al. |
| 5,570,315 A | 10/1996 | Tanaka et al. |
| 5,595,924 A | 1/1997 | Yuan et al. |
| 5,768,192 A | 6/1998 | Eitan |
| 5,774,397 A | 6/1998 | Endoh et al. |
| 5,903,495 A | 5/1999 | Takeuchi et al. |
| 6,011,287 A | 1/2000 | Itoh et al. |
| 6,011,725 A | 1/2000 | Eitan |
| 6,046,935 A | 4/2000 | Takeuchi et al. |
| 6,191,975 B1 * | 2/2001 | Shimizu et al. ........ 368/185.17 |
| 6,504,757 B1 | 1/2003 | Hollmer et al. |
| 6,747,899 B2 * | 6/2004 | Hsia et al. .............. 365/185.28 |
| 6,807,103 B2 * | 10/2004 | Cavaleri et al. ........ 365/185.23 |
| 2002/0126532 A1 | 9/2002 | Matsunaga et al. |

OTHER PUBLICATIONS

EPO/ISA, "Notification of Transmittal of the International Search Report and the Written Opinion of the International Searching Authority, or the Declaration", mailed in corresponding PCT/US2004/030420 on Jan. 28, 2005, 12 pages.

* cited by examiner

Primary Examiner—Anh Phung
Assistant Examiner—Toan Le
(74) Attorney, Agent, or Firm—Parsons Hsue & de Runtz LLP

(57) ABSTRACT

When programming a contiguous page of memory storage units, every time a memory storage unit has reached its targeted state and is program-inhibited or locked out from further programming, it creates a perturbation on an adjacent memory storage unit still under programming. The present invention provides as part of a programming circuit and method in which an offset to the perturbation is added to the adjacent memory storage unit still under programming. The offset is added as voltage offset to a bit line of a storage unit under programming. The voltage offset is a predetermined function of whether none or one or both of its neighbors are in a mode that creates perturbation, such as in a program inhibit mode. In this way, an error inherent in programming in parallel high-density memory storage units is eliminated or minimized.

25 Claims, 16 Drawing Sheets

| LEFT NEIGHBOR | | | Programming Storage Unit | RIGHT NEIGHBOR | | |
|---|---|---|---|---|---|---|
| MODE | $INV_L$ | $V_{BL\text{-}1}$ | Bit line Offset $\Delta V_{BL\text{-}0}$ | MODE | $INV_R$ | $V_{BL\text{-}1'}$ |
| Program Inhibit | LOW | $V_{DD}$ | $\Delta V_{11}$ (e.g., 0.3V) | Program Inhibit | LOW | $V_{DD}$ |
| Program Inhibit | LOW | $V_{DD}$ | $\Delta V_{10}$ (e.g., 0.15V) | Program | HIGH | $\Delta V$ |
| Program | HIGH | $\Delta V$ | $\Delta V_{01}$ (e.g., 0.15V) | Program Inhibit | LOW | $V_{DD}$ |
| Program | HIGH | $\Delta V$ | $\Delta V_{00}$ (e.g., 0V) | Program | HIGH | $\Delta V$ |

*FIG. 11*

NON-VOLATILE MEMORY AND METHOD WITH BIT LINE COMPENSATION DEPENDENT ON NEIGHBORING OPERATING MODES

FIELD OF THE INVENTION

This invention relates generally to non-volatile semiconductor memory such as electrically erasable programmable read-only memory (EEPROM) and flash EEPROM, and specifically ones having improved programming and sensing circuits for a page of contiguous row of charge storage units.

BACKGROUND OF THE INVENTION

Solid-state memory capable of non-volatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time, a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling). Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage unit.

FIG. 1 illustrates schematically a non-volatile memory cell in the form of an EEPROM cell. It has a charge storage unit in the form of a floating gate. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 2 illustrates schematically a string of charge storage units organized into a NAND cell or string. A NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on by the signal SGS, the source terminal is coupled to a source line. Similarly, when the drain select transistor S2 is turned on by the signal SGD, the drain terminal of the NAND cell is coupled to a bit line of the memory array. Each memory transistor in the chain has a charge storage unit to store a given amount of charge so as to represent an intended memory state. Between each source and drain of each memory transistor is a channel region. Voltage on a control gate on each memory transistor, such as 60, 62, . . . , 64 controls current conduction in the channel of the memory transistors M1, M2, . . . , Mn respectively. The select transistors S1, S2 provides control access to the NAND cell via its source terminal 54 and drain terminal 56 respectively and each is turned on by appropriate voltage to its control gate.

When an addressed memory transistor within a NAND cell is read or verified during programming, its control gate is supplied with an appropriate reference voltage. At the same time, the rest of the non-addressed memory transistors in the NAND cell 50 are fully turned on by application of a sufficient voltage $V_{PASS}$ on their control gates. In this way, a conductive path is effectively created from the source of the individual memory transistor to the source terminal 54 of the NAND cell and likewise for the drain of the individual memory transistor to the drain terminal 56 of the cell. Similarly during programming, the memory transistor to be programmed has its control gate supplied with a programming voltage $V_{PGM}$, while the other memory transistors in string have their control gate supplied with the pass voltage $V_{PASS}$. Memory devices with such NAND cell structures are described in U.S. Pat. Nos. 5,570,315, 5,903,495 and 6,046,935.

Another similar non-volatile memory has each of its charge storage units in the form of a dielectric layer. Instead of the conductive floating gate elements described earlier, a dielectric layer is used. Such memory devices utilizing dielectric storage element have been described by Eitan et al., "NROM: A Novel Localized Trapping, 2-Bit Non-volatile Memory Cell," IEEE Electron Device Letters, vol. 21, no. 11, November 2000, pp. 543–545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines.

FIG. 3 illustrates an example of an array of NAND cells, such as that shown in FIG. 2. Along each column of NAND cells, a bit line 36 is coupled to the drain terminal 56 of each NAND cell. Along each row of NAND cells, a source line 34 may connect all their source terminals 54. Also the control gates 60, . . . , 64 of the NAND cells along a row are connected to a series of corresponding word lines. An entire row of NAND cells can be addressed by turning on the pair of select transistors (see FIG. 2) with appropriate voltages on their control gates SGD and SGS via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of a NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more erase blocks of data, the size of the erase block being defined by the host system. An example is an erase block of 512 bytes of user data, following a standard established with magnetic disk drives, plus some number of bytes of overhead information about the user data and/or the block in with it is stored. In other systems, the erase block size can be much larger than 512 bytes.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level or $I_{REF}$, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation, the detection of the conduction current relative to a threshold current is accomplished by examining the rate the conduction current is discharging through the capacitance of the bit line.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads). If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner. This approach improves performance but does have a repercussion on the accuracy of read and write operations.

Another issue has to do with bit line to bit line coupling or crosstalk. This problem becomes more acute with parallel sensing of closely spaced bit lines. A conventional solution to avoid bit line to bit line crosstalk is to sense either all even or all odd bit lines at a time while grounding the other bit lines. This architecture of a row consisting of two interleaved pages will help to avoid bit line crosstalk as well as to alleviate the problem of densely fitting the page of read/write circuits. A page decoder is used to multiplex the set of read/write modules to either the even page or the odd page. In this way, whenever one set of bit lines are being read or programmed, the interleaving set can be grounded to eliminate crosstalk between odd and even bit lines, but not between odd lines or even lines.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage unit is sandwiched between a channel region and a control gate. The current that flows in the channel region is a function of the resultant electric field contributed by the field at the control gate and the charge storage unit. With ever increasing density, memory transistors are formed closer and closer together. The field from neighboring charge elements then becomes a significant contributor to the resultant field of an affected cell. The neighboring field depends on the charge programmed into the charge storage unit of the neighbors. This perturbing field is dynamic in nature as it changes with the programmed states of the neighbors. Thus, an affected cell may read differently at different times depending on the changing states of the neighbors.

The conventional architecture of interleaving page exacerbates the error caused by neighboring charge storage unit coupling. Since the even page and the odd page are programmed and read independently of each other, a page may be programmed under one set of conditions but read back under an entirely different set of conditions, depending on what has happened to the intervening page in the meantime. The read errors will become more severe with increasing density, requiring a more accurate read operation and wider partitioning of the threshold window for multi-state implementation. Performance will suffer and the potential capacity in a multi-state implementation is limited.

U.S. patent applications, Ser. Nos. 10/254483 and 10/254290 filed on Sep. 24, 2002, disclose a memory architecture in which a page of contiguous memory storage units are programmed or read in parallel. As programming is performed on a page of contiguous memory storage units, during the process those memory storage units that have been programmed to their targeted state will be program-inhibited or locked out from further programming. In a preferred scheme, the memory storage units are locked out by floating their channels and boosting the voltage there to inhibit programming. This boosted voltage creates a significant perturbation on an adjacent storage unit still under programming.

Therefore there is a general need for high performance and high capacity non-volatile memory. In particular, there is a need to have a high capacity non-volatile memory with improved read and program performance that effectively manages the aforementioned problems.

SUMMARY OF INVENTION

These needs for a high capacity and high performance non-volatile memory device are met by having a large page of read/write circuits to read and write a corresponding page of memory cells in parallel. In particular, perturbation effects inherent in high-density chip integration that may introduce errors into reading and programming are either eliminated or minimized.

The present invention provides device and method for memory operation on a group of memory cells in parallel. Each memory cell among the group may exist in one of several operation modes. For example, when programming the group some memory cells may be in a program inhibit mode. A memory cell of the group undergoing a given memory operation can be disturbed by its neighbors. The extend of the perturbation depends on the operation modes the neighbors are in. The perturbation is compensated by an offset voltage applied to the bit line of the memory cell, the offset being a function of the operation modes of its neighbors.

The present invention provides as part of a programming circuit and method in which the perturbation from neighboring storage units is offset by adding an offset to the bit line voltage of the memory storage unit slated for programming. The offset is a function of what operation modes the two neighbors are in. If one or more of the neighbors are in an operation mode that creates a perturbation, the offset is adjusted accordingly to minimize the perturbation.

In particular, when programming a contiguous page of storage units, every time a storage unit has reached its targeted state and is program-inhibited or locked out from further programming, it creates a perturbation on an adjacent storage unit still under programming. The present invention provides as part of a programming circuit and method in which an offset to the perturbation is added to the adjacent storage unit still under programming. The offset is added by applying a predetermined biased voltage to the bit line of a storage unit still under programming. In particular, if the storage unit is flanked by two neighbors in program inhibit mode, the predetermined offset will compensate for the perturbation from both neighbors. If the storage unit is has only one of its neighbors in program inhibit mode, the bit line offset will be less, sufficient to compensate for just one neighbor. If the storage unit is not flanked by any neighbors in program inhibit mode, the offset will effectively be zero. In this way, an error inherent in programming in parallel high-density memory storage units is eliminated or minimized.

According to a preferred embodiment, each storage unit has its bit line voltage set as a function of the operation modes of its neighbors, whether it is in program inhibit mode or programming mode. The operation mode can be determined from a signal obtained from the sense module of each of its neighbors. Alternatively, the operation mode of each of its neighbors is determined by the voltage condition on the bit line of each of its neighbors. A bit line voltage selector enables the appropriate bit line voltage with the appropriate offset to be supplied to the bit line as a function of the operation modes of the neighbors. In this way, the perturbation by the program-inhibited storage unit on the still to be programming storage unit is sensed and compensated by the appropriate application of bit line voltage offset.

Additional features and advantages of the present invention will be understood from the following description of its preferred embodiments, which description should be taken in conjunction with the accompanying drawings.

BRIEF DESCRIPTION OF THE DRAWINGS

FIG. 11 is a bias voltage table listing the offset voltage applied to the bit line of a programming storage unit as a function of the program-inhibit states of its left and right neighbors.

DETAILED DESCRIPTION OF THE PREFERRED EMBODIMENTS

All Bit Line Programming

Figure 4A:
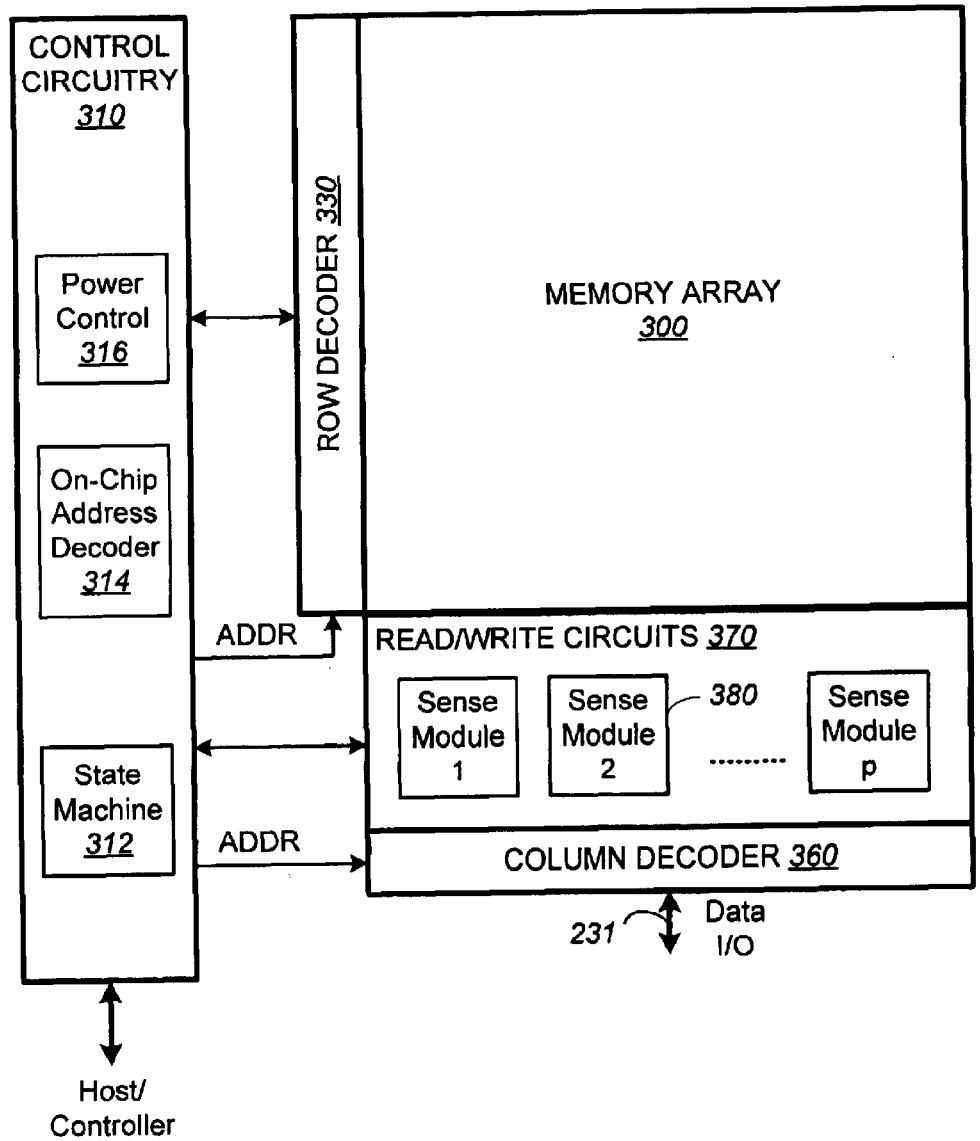
FIG. 4A illustrates schematically a memory device having read/write circuits for reading and programming a page of memory cells in parallel, according to one embodiment of the present invention.
Figure 8:
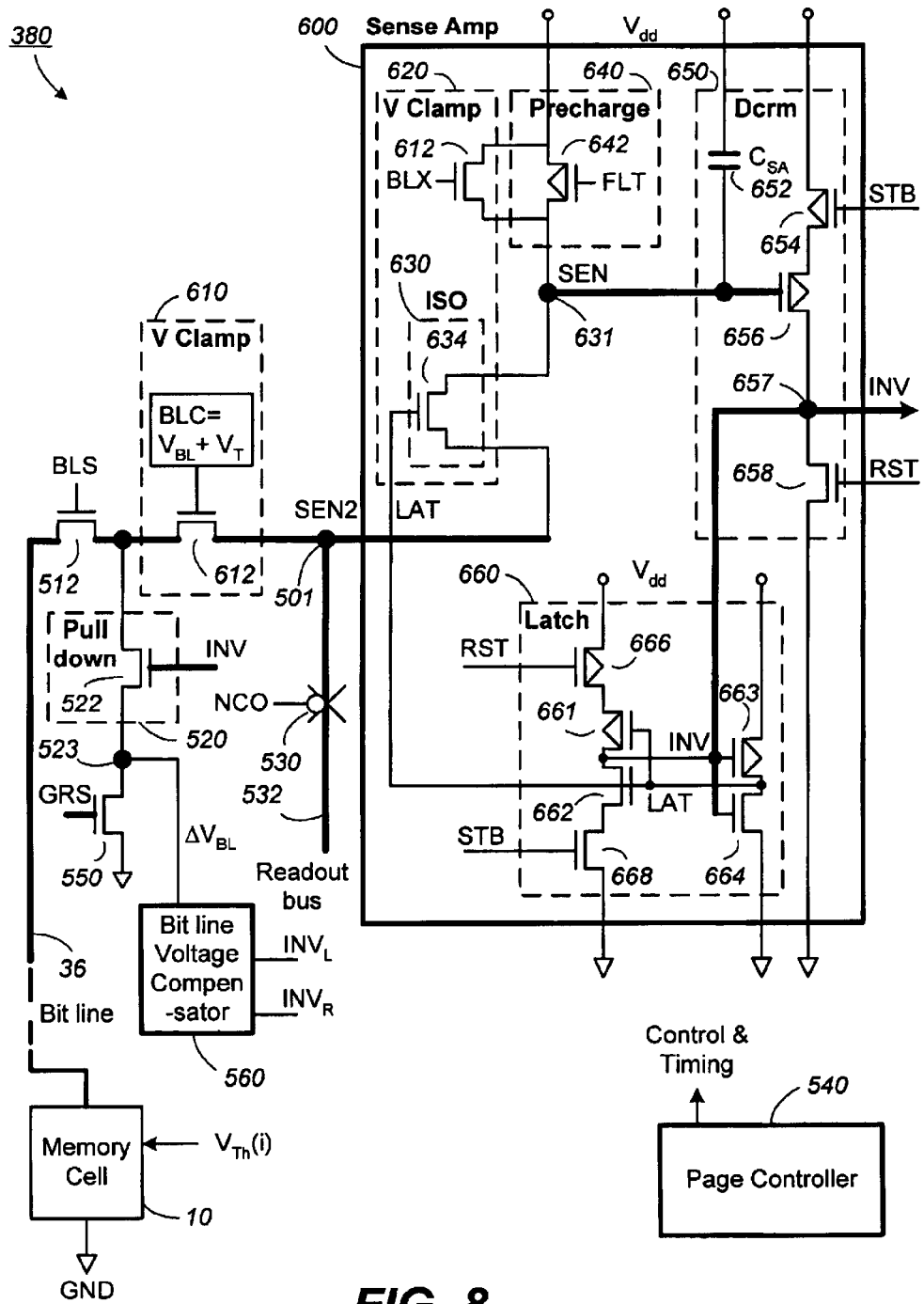
FIG. 8 illustrates a preferred sense module implementing the various aspects of the present invention.

The sense module 380 shown in FIG. 4A and FIG. 8 is preferably implemented in a memory architecture configured to perform all-bit-line sensing. In other words, contiguous memory cells in a row are each connectable to a sense module to perform sensing in parallel. Such a memory architecture is also disclosed in co-pending and commonly assigned U.S. patent application Ser. No. 10/254,483 filed by Cernea et al., on Sep. 24, 2002 entitled, "Highly Compact Non-Volatile Memory And Method Thereof." The entire disclosure of said patent application is hereby incorporated herein by reference.

As described earlier, the number of memory cells in a "page" that are programmed or read simultaneously may vary according to the size of data sent or requested by a host system. Thus, there are several ways to program the memory cells coupled to a single word line, such as (1) programming even bit lines and odd bit lines separately, which may comprise upper page programming and lower page programming, (2) programming all the bit lines ("all-bit-line programming"), or (3) programming all the bit lines in a left or right page separately, which may comprise right page programming and a left page.

FIG. 4A illustrates schematically a memory device having read/write circuits for reading and programming a page of memory cells in parallel, according to one embodiment of the present invention. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 include multiple sense modules 380 and allow a page of memory cells to be read or programmed in parallel.

In the present invention, the page of memory cells to be read or programmed in parallel is preferably a row of contiguous memory storage cells or storage units. In other embodiments, the page is a segment of a row of contiguous memory storage cells or storage units.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 4B:
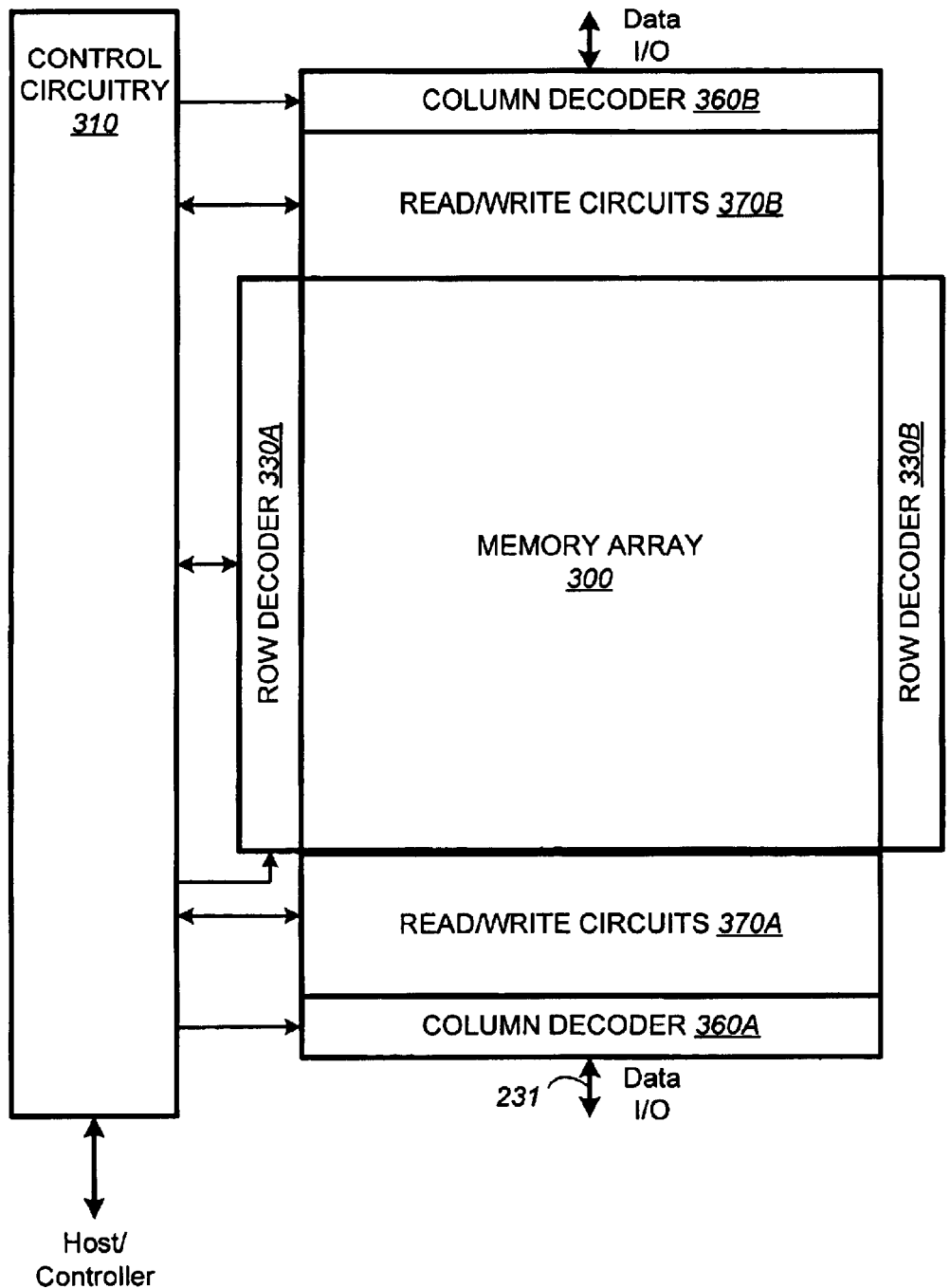
FIG. 4B illustrates a preferred arrangement of the memory device shown in FIG. 4A.

FIG. 4B illustrates a preferred arrangement of the memory device shown in FIG. 4A. Access to the memory array 300 by the various peripheral circuits is implemented in a symmetric fashion, on opposite sides of the array so that the densities of access lines and circuitry on each side are reduced in half. Thus, the row decoder is split into row decoders 330A and 330B and the column decoder into column decoders 360A and 360B. Similarly, the read/write circuits are split into read/write circuits 370A connecting to bit lines from the bottom and read/write circuits 370B connecting to bit lines from the top of the array 300. In this way, the density of the read/write modules, and therefore that of the sense modules 380, is essentially reduced by one half.

Boosted Voltage on Channel and Charge Storage Unit

An error inherent in high-density integrated circuit, non-volatile memory device is due to the coupling of neighboring charge storage units and channel regions. If the channel region and charge storage unit of one memory storage unit is boosted relative to an adjacent one, it will cause a perturbation on the charge storage unit of the adjacent unit. This effect is more pronounced when the memory storage units being programmed in parallel are densely packed or inadequately shielded.

Figure 1:
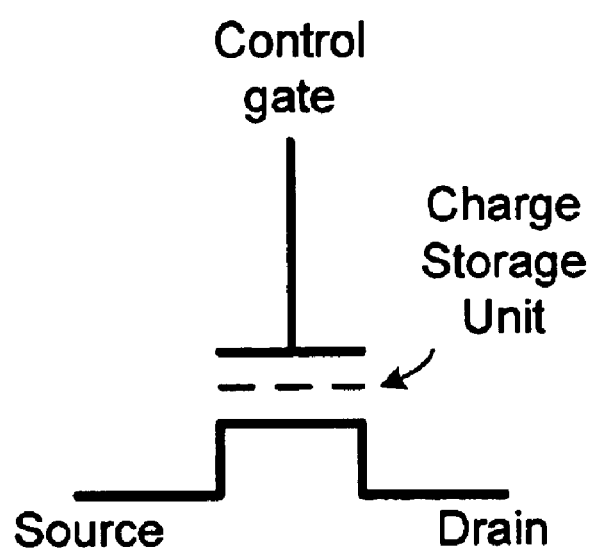
FIG. 1 illustrates schematically a non-volatile memory cell in the form of an EEPROM cell.
Figure 2:
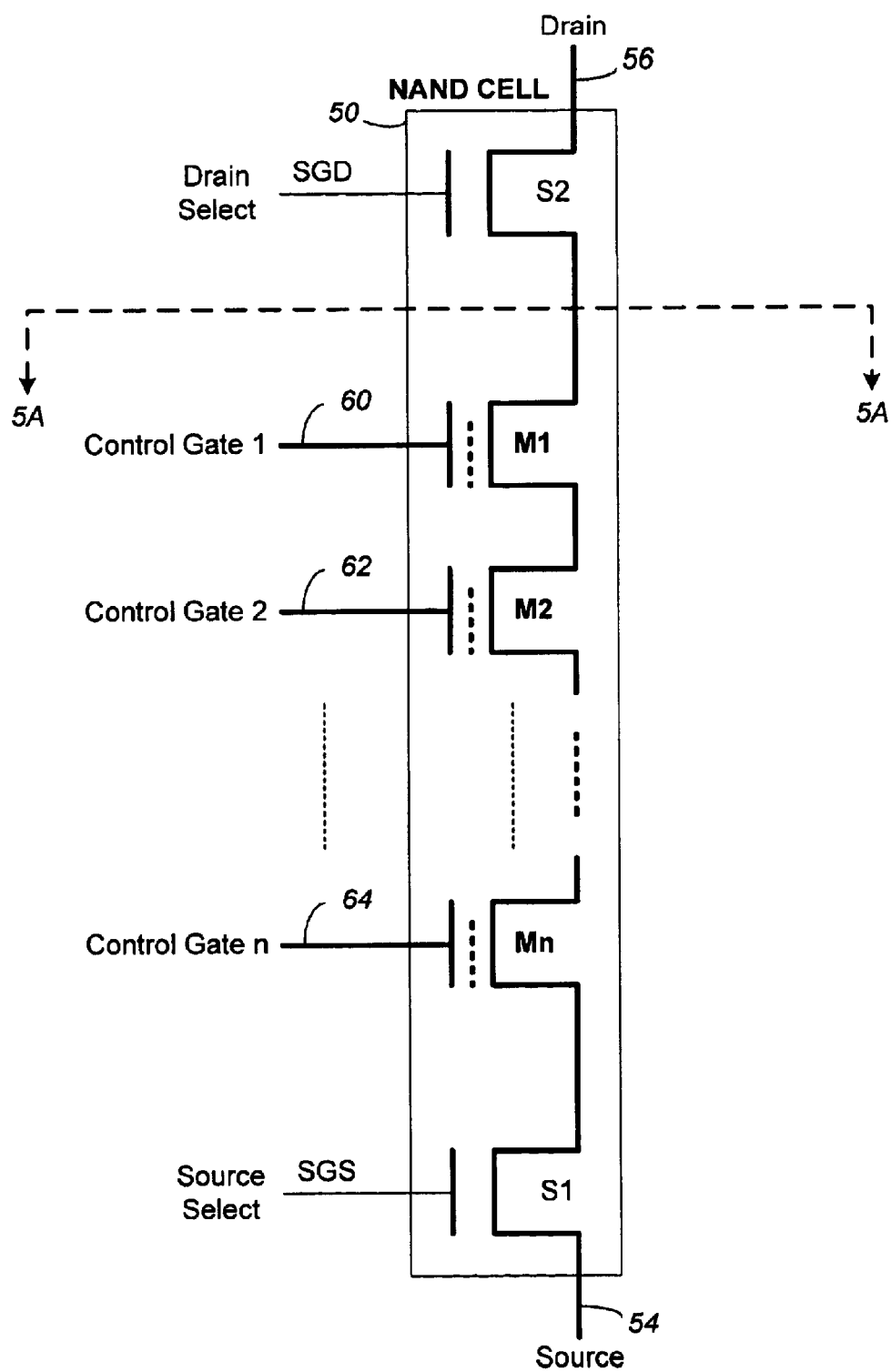
FIG. 2 illustrates schematically a string of charge storage units organized into a NAND cell or string.
Figure 5A:
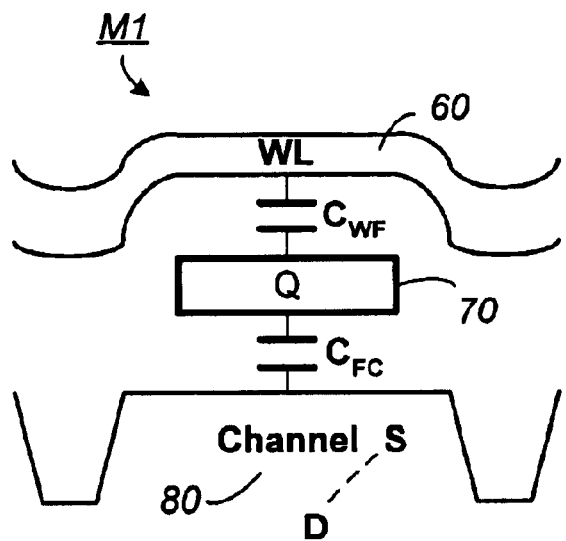
FIG. 5A illustrates a sectional perspective view of a memory transistor along the direction 5A–5A shown in FIG. 2 and the equivalent capacitance between the charge storage unit and the word line and between the charge unit and the channel.

FIG. 5A illustrates a sectional perspective view of a memory transistor along the direction 5A—5A shown in FIG. 2 and the equivalent capacitance between the charge storage unit and the word line and between the charge unit and the channel. The memory transistor M1 has the control gate 60 being formed as part of a word line running along a row of the NAND array 100 (see FIG. 3). In this view, the drain is coming out of the page of FIG. 5A and the source is at the back, defining a channel region 80 in between. A charge storage unit 70 is interposed between the control gate 60 and the channel 80 and is insulated from both of them by layers of dielectric material. The electrical coupling between the charge storage unit 70 and the control gate 60 can be modeled by an equivalent capacitor $C_{WF}$. Similarly, the coupling between the charge storage unit 70 with the channel 80 can be modeled by an equivalent capacitor $C_{FC}$.

Figure 5B:
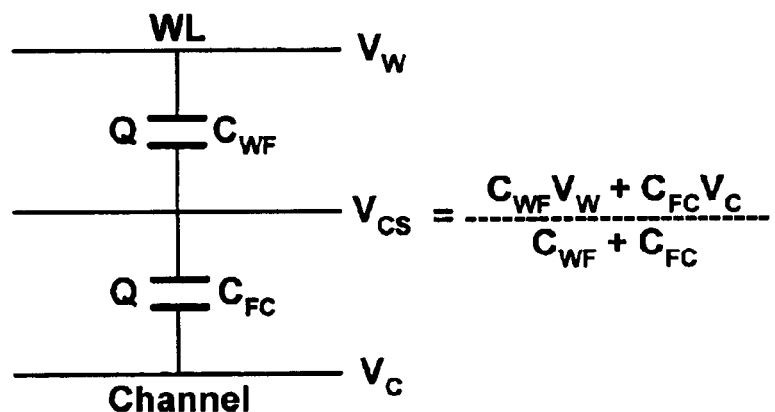
FIG. 5B illustrates schematically the capacitive coupling of the memory transistor shown in FIG. 5A, showing in particular the voltage at the charge storage unit due to the voltage at the channel and the voltage at the word line.

FIG. 5B illustrates schematically the capacitive coupling of the memory transistor shown in FIG. 5A, showing in particular the voltage at the charge storage unit due to the voltage at the channel and the voltage at the word line. If the charge storage unit 70 is storing Q amount of charge, then $C_{WF}$ and $C_{FC}$ both hold the same charge. The voltage at the charge storage unit 70, $V_{CS}=(C_{WF}V_W+C_{WF}V_C)/(C_{WF}+C_{FC})$. It can be readily seen that generally the voltage of the charge storage unit increases with increasing voltage at the channel and/or at the word line. As will be described in the next section, when a memory transistor such as M1 is placed in a program inhibit mode, the channel voltage is boosted to a high voltage. Therefore this will also result in a boosted voltage at the charge storage unit. The combination of boosted voltages at the channel 80 and the charge storage unit 70 will have a perturbation effect on adjacent memory transistors engaged in a programming mode.

Program Overshoot Due to an Adjacent Unit in Boosted (Program Inhibit) State

Figure 3:
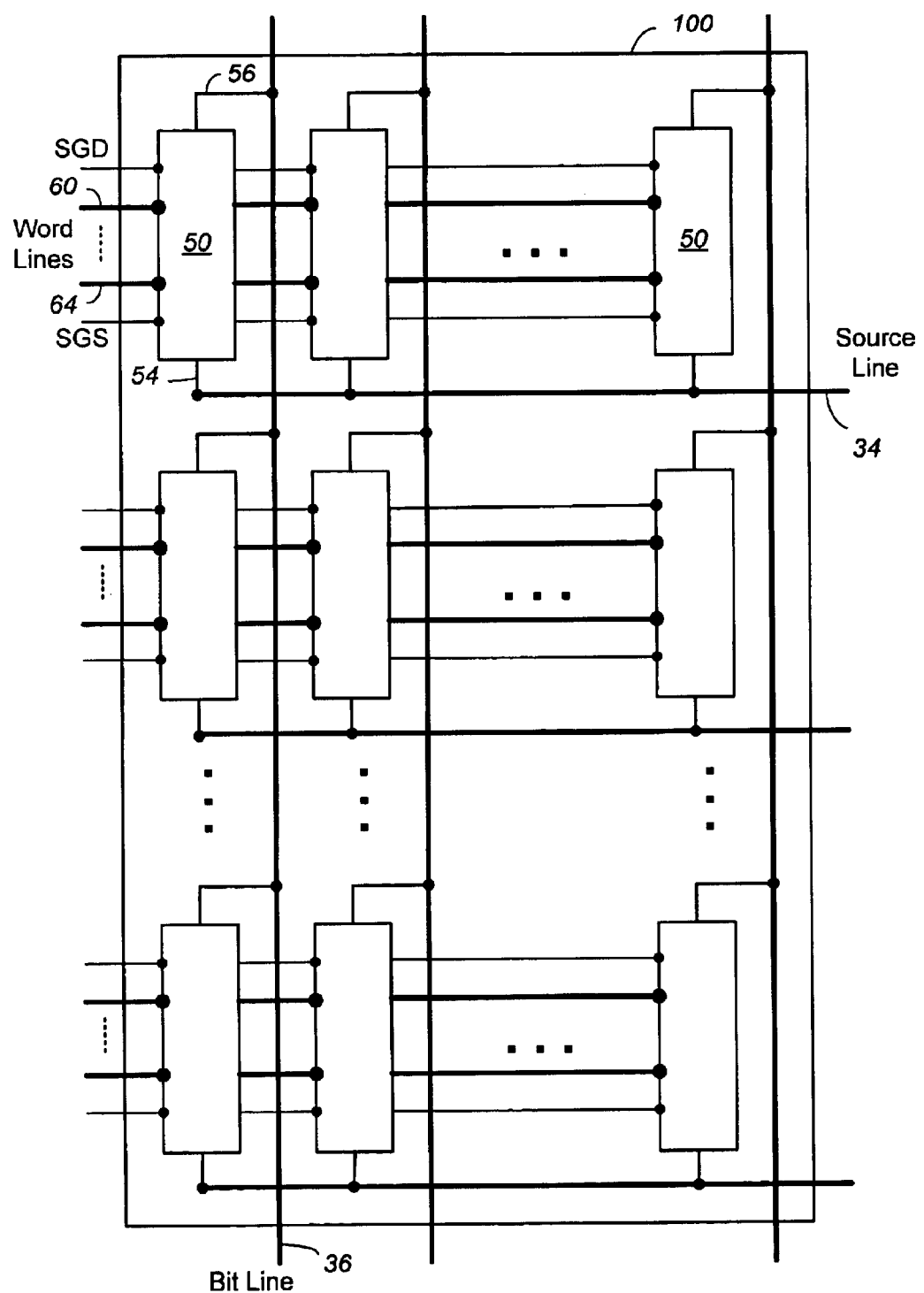
FIG. 3 illustrates an example of an array of NAND cells, such as that shown in FIG. 2.
Figure 6A:
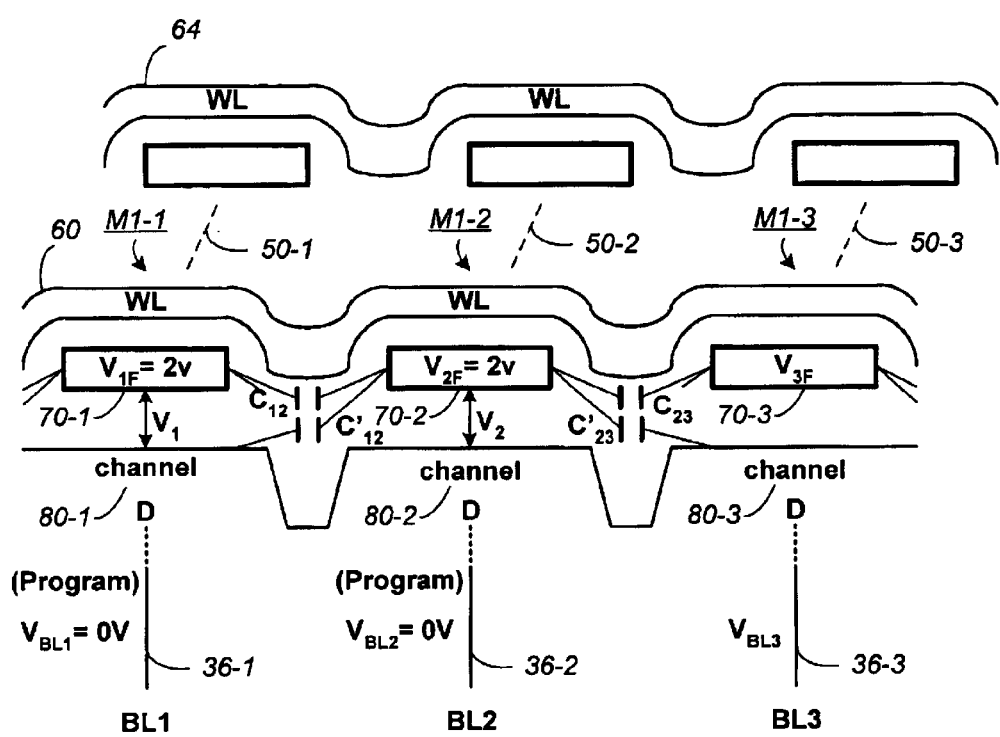
FIG. 6A illustrates a sectional perspective view of the array of NAND cells shown in FIG. 3 for the case when two adjacent memory transistors are both in programming mode.

FIG. 6A illustrates a sectional perspective view of the array of NAND cells shown in FIG. 3 for the case when two adjacent memory transistors are both in programming mode. For example, FIG. 6A may represent three adjacent memory transistors, such as M1-1, M1-2 and M1-3 respectively belonging to the NAND strings 50-1, 50-2 and 50-3, along a row sharing the same word line 60. The NAND strings 50-1, 50-2 and 50-3 respectively have bit lines 36-1, 36-2 and 36-3 connectable to them. The memory transistors M1-1, M1-2 and M1-3 have corresponding charge storage units 70-1, 70-2 and 70-3 and channels 80-1, 80-2 and 80-3.

With increasing density of the memory array, the memory transistors are formed closer together and their effect on each other becomes more significant. For example, the threshold voltage of the memory transistor M1-2 is dependent on the voltage on its charge storage unit 70-2. Because of the close proximity to its adjacent neighbors M1-1 and M1-3, the voltages at the channels and charge storage units of M1-1 and M1-3 can affect the voltage on the charge storage unit of M1-2. For example, the charge storage unit 70-2 may be regarded as coupled to its adjacent charge storage units 70-1 and 70-3 respectively by equivalent capacitors $C_{12}$ and $C_{23}$. Similarly, the charge storage unit 70-2 may be regarded as coupled to its adjacent channels 80-1 and 80-3 respectively by equivalent capacitors $C'_{12}$ and $C'_{23}$. The closer the spacing between the memory transistors, the more will the coupling be between them.

FIG. 6A illustrates the case when two adjacent memory transistors M1-2 and M1-1 are both in programming mode. Focusing on the effect on M1-2 due to M1-1, there is little variation due to the word line and bit line voltages since they are the same for M1-2 and M1-1. The channel voltages are also similar. The only variation seen by the charge storage unit 70-2 is due to that of the charge storage unit 70-1, which is mainly a function of the charge it is holding or its data representation. For example, the voltage on the charge storage units of M1-1 and M1-2 may be about 1 to 2V. The perturbation due to this type of perturbation is typically accounted for by allowing sufficient margin between two different memory states.

Figure 6B:
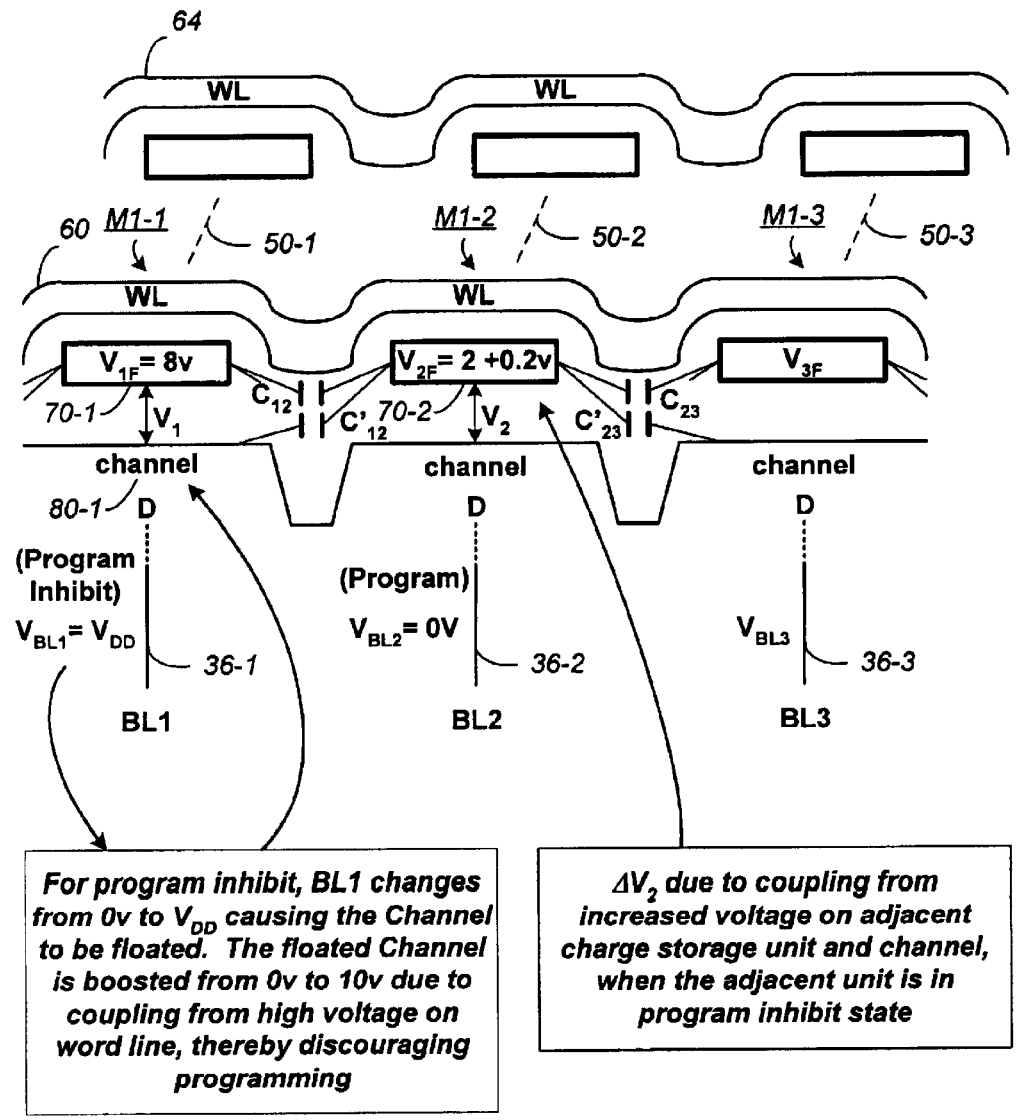
FIG. 6B illustrates a sectional perspective view of the NAND array similar to FIG. 6A, except one of the adjacent memory transistors is in program inhibit mode.

FIG. 6B illustrates a sectional perspective view of the NAND array similar to FIG. 6A, except one of the adjacent memory transistors is in program inhibit mode. In this case, M1-2 is being programmed while M1-1 is inhibited from further programming. The word line voltage remains the same for both but the voltage on the bit line 36-1 of M1-1 has now changed to $V_{DD}$, which is a predetermined system voltage, e.g., ~2.5V. This effectively turns off the select transistor S2 (see FIG. 2), disconnects the NAND chain 50-1 from its bit line 36-1, and floats the channel 80-1 of M1-1 so that it can be capacitively boosted up to a high voltage when a high voltage appears on the word line 60. For example, in this way, the channel 80-1 of M1-1 can be boosted to 10V. Boosting up the channel voltage will effectively reduce the potential difference between the channel and the charge storage unit, thereby discouraging pulling electrons from the channel to the charge storage unit to effect programming.

In view of the discussion in connection with FIG. 5B earlier, a boosted channel will cause a boosted charge storage unit. For example, when the memory transistor M1-1 is in program inhibit mode, it can results in a voltage boost at the channel 80-1 of about 10V and a voltage boost at the charge storage unit 70-1 from 2V to 8V. This can significantly perturb a neighboring memory transistor (e.g., M1-2) to be programmed. The charge storage unit 70-2 of M1-2 may for example have its voltage boosted by $\Delta V_2$~0.2V. This is due to its charge storage unit 70-2 being capacitively coupled, e.g., $C_{12}$ and $C'_{12}$ respectively, to the charge storage unit 70-1 and the channel 80-1 of the boosted (program inhibited) memory transistor M1-1. Typically, the memory transistor's threshold voltage is programmed in steps of between 0.8V to about 0.1V or less, this will results in M1-2 being erroneously programmed to a higher threshold value than expected.

So far the discussion has focused on the perturbation effect on the memory transistor M1-2 due to M1-1. If M1-3 is also in program inhibit mode, its boosted voltage will couple in similar manner to contribute to the boosting of the voltage on the charge storage unit 70-2 of M1-2. In the worst case where the memory transistor M1-2 is in program mode while its neighbors M1-1 and M1-3 on either side are being locked out (program inhibited) from further programming, the perturbation on the charge storage unit 70-2 of M1-2 can be as high as 0.2V. To M1-2 under programming, this effect is equivalent to the programming voltage on its control gate being increased by as high as 0.4V. This can cause over-programming to the wrong state under some circumstances. For example, the memory cell may have its threshold window partitioned with a separation of about 0.3V and the programming pulse step is incremented by about 0.1V each time so that it typically takes more than one pulse to traverse each partition. A current programming pulse step may bring M1-2 to just below the threshold region designating the desired programmed state. At the same time the current pulse step may program M1-1 and M1-3 to their final state so that they are locked out from further programming by entering into program inhibit mode. Thus, in the next programming pulse step, M1-2 is suddenly subjected to a large programming step of as much as 0.5V. This will likely make M1-2 over shoot the desired threshold region and be programmed erroneously into the next memory state.

A scheme using bit line to bit line coupling to correct the perturbation is disclosed in co-pending and co-owned United States Patent Application, entitled, "Non-volatile memory and method with bit line to bit line coupled compensation" filed on the same day and by the same inventors as the present application. The entire disclosure of the referenced application is hereby incorporated herein by reference.

Bit Line Compensation for Perturbation Due to Neighbor's Voltage Boost

FIGS. 7A–7D illustrate various permutations of memory operation mode for neighbors of a memory cell under programming. The memory cell under programming is part of the NAND cell 50 which is coupled to a bit line 36-0. The neighboring NAND cells are respectively 51 on the left and 51' on the right, coupled to bit lines 36-1 and 36-1' respectively.

Figure 7A:
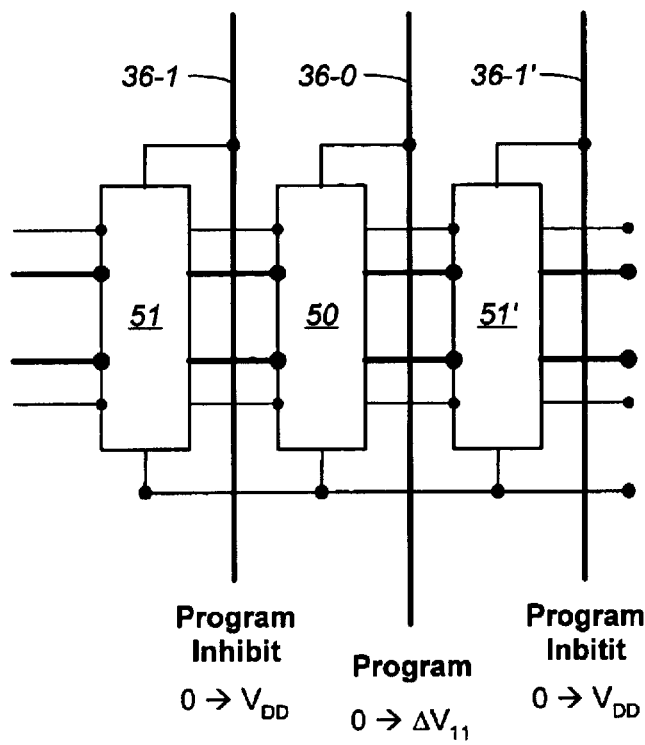
FIGS. 7(A)–7(D) schematically illustrates the different bit line voltage offsets for a programming storage unit as a function of the program inhibit states of its left and right neighbors.

FIG. 7A shows the configuration where both neighbors 51 and 51' flanking the NAND cell 50 are in a program inhibit mode. This means that the NAND cell undergoing programming will be perturbed by the boosted channel of the neighboring cells from both sides. Referring to FIG. 6B again, the memory cell or storage unit under programming is M1-2 and its left neighbor is M1-1. The boosted channel of M1-1 results in a perturbation in the form of an effective increase in the potential at the floating gate 70-2 of M1-2 by a voltage $\Delta V_2$ (e.g. 0.2V). By the same token, if the other neighbor M1-3 is also program inhibited, its boosted channel will also contribute to the increase in the voltage at the floating gate 70-2 to produce a total $\Delta V_2$ (e.g. 0.4V.)

The memory transistor M1-2 is being programmed having the voltage at the charge storage unit 70-2 of M1-2 boosted by $\Delta V_2$ will therefore result in a programming error.

According to a preferred embodiment, the perturbing $\Delta V_2$ at the charge storage unit 70-2 is compensated by introducing a similar amount on the bit line 36-2. This bit line compensated voltage will be passed to the channel so that the net change in the potential difference between the charge storage unit 70-2 and the channel 80-2 will be effectively zero. In this way, any errors in the threshold voltage will be canceled out.

Thus, according to the present inventive scheme illustrated in FIG. 7A, this increased voltage is substantially offset by a predetermined voltage bias $\Delta V_{11}$ of a similar amount applied to the bit line of M1-2.

Figure 7B:
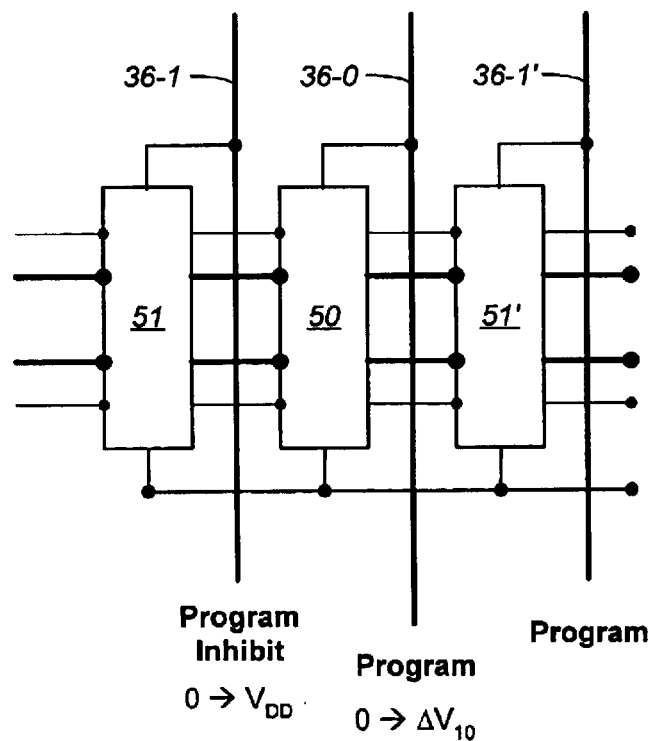
Figure 7C:
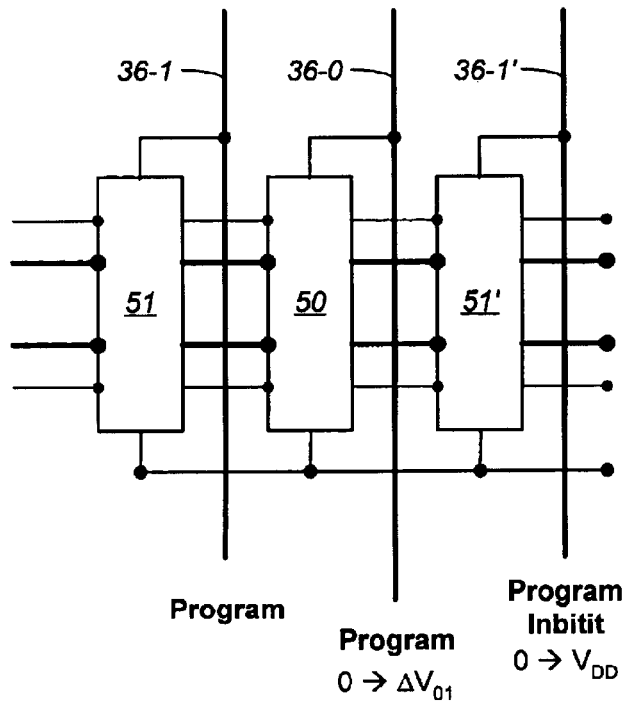

FIG. 7B and FIG. 7C show configurations where one of the neighbors 50-1 and 50-1' flanking the NAND cell 50 is in a program inhibit mode while the other is in a program mode. This means that the NAND cell undergoing programming will be perturbed by the boosted channel of only one of the neighboring cells. Thus, the boosted channel of one of the neighbors will contribute to the increase in the voltage at the floating gate 70-2 to produce a total $\Delta V_2$ (e.g., 0.2V.) According to the present inventive scheme, this increased voltage is substantially offset by a predetermined voltage bias $\Delta V_{10}$ (or $\Delta V_{01}$) of a similar amount applied to the bit line of M1-2.

Figure 7D:
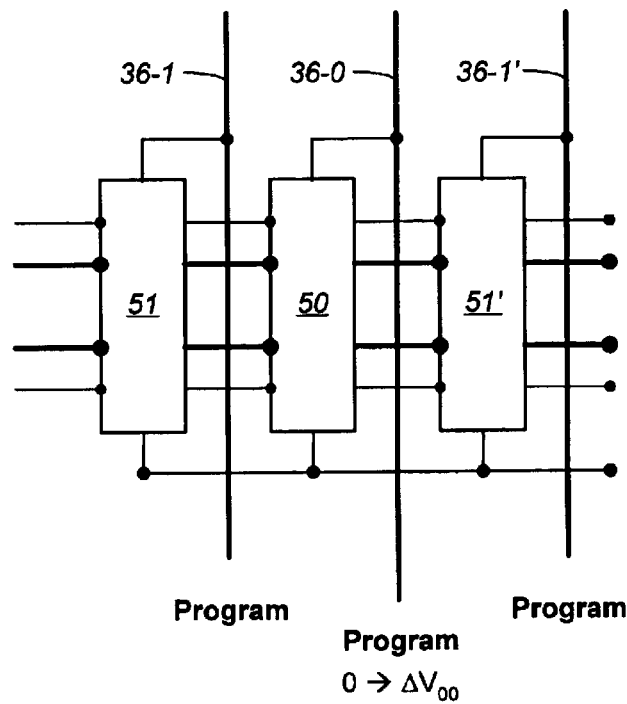

FIG. 7D show configurations where none of the neighbors 50-1 and 50-1' flanking the NAND cell 50 is in a program inhibit mode. This means that the NAND cell undergoing programming will be not be perturbed by its neighboring cells. Thus, the neighboring channel will not contribute any increase in the voltage at the floating gate 70-2. Thus, $\Delta V_2$ will be 0V due to the absence of any boosted channels and the corresponding offset predetermined voltage $\Delta V_{00}$ or bit line bias voltage will also be 0V.

FIG. 8 illustrates a preferred sense module implementing the various aspects of the present invention. The sense module 380 comprises a bit line isolation transistor 502, a bit line pull down circuit 520, a bit line voltage clamp 610, a readout bus transfer gate 530 and a sense amplifier 600.

In general, a page of memory cells are operated on in parallel. Therefore a corresponding number of sense modules are in operation in parallel. In one embodiment, a page controller 540 expediently provides control and timing signals to the sense modules operated in parallel.

The sense module 380 is connectable to the bit line 36 of a memory cell 10 when the bit line isolation transistor 502 is enabled by a signal BLS. The sense module 380 senses the conduction current of the memory cell 10 by means of the sense amplifier 600 and latches the read result as a digital voltage level SEN2 at a sense node 501 and outputs it to a readout bus 532.

The sense amplifier 600 essentially comprises a second voltage clamp 620, a precharge circuit 640, a discriminator or compare circuit 650 and a latch 660. The discriminator circuit 650 includes a dedicated capacitor 652.

One feature of the sense module 380 is the incorporation of a constant voltage supply to the bit line during sensing. This is preferably implemented by the bit line voltage clamp 610. The bit line voltage clamp 610 operates like a diode clamp with a transistor 612 in series with the bit line 36. Its gate is biased to a constant voltage BLC equal to the desired bit line voltage $V_{BL}$ above its threshold voltage $V_T$. In this way, it isolates the bit line from the sense node 501 and sets a constant voltage level for the bit line, such as the desired $V_{BL}$=0.5 to 0.7 volts during program-verifying or reading. In general the bit line voltage level is set to a level such that it is sufficiently low to avoid a long precharge time, yet sufficiently high to avoid ground noise and other factors.

The sense amplifier 600 senses the conduction current through the sense node 501 and determines whether the conduction current is above or below a predetermined value. The sense amplifier outputs the sensed result in a digital form as the signal SEN2 at the sense node 501 to the readout bus 532.

The digital control signal INV, which is essentially an inverted state of the signal SEN2, is also output to control the pull down circuit 520. When the sensed conduction current is higher than the predetermined value, INV will be HIGH and SEN2 will be LOW. This result is reinforced by the pull down circuit 520. The pull down circuit 520 includes an n-transistor 522 controlled by the control signal INV and another n-transistor 550 controlled by the control signal GRS. The GRS signal basically allows the bit line 36 to be floated when its goes LOW regardless of the state of the INV signal. During programming, the GRS signal goes HIGH to allow the bit line 36 to be pulled to ground. When the bit line is required to be floated, the GRS signal goes LOW.

FIGS. 14(H)–14(O) illustrates the timing of the preferred sense module shown in FIG. 8 in relation to the features of the present invention. Detailed description of the operation of the preferred sense module in regards to other inventive features has been described and claimed in co-pending and co-owned U.S. patent application Ser. No., 10/254830 filed on Sep. 24, 2002 by Adrian-Raul Cernea and Yan Li. The entire disclosure of the referenced application is hereby incorporated herein by reference.

Figure 9:
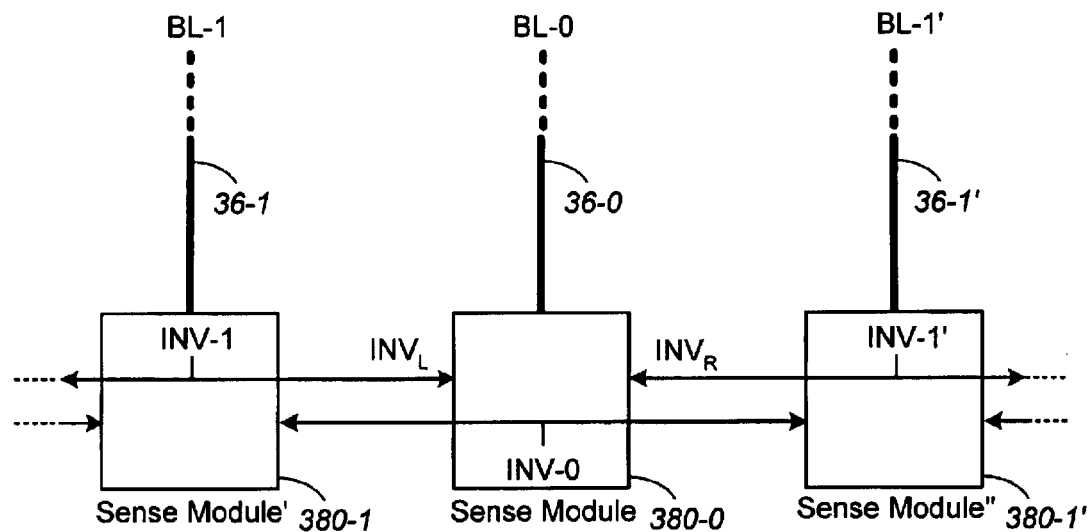
FIG. 9 illustrates a sense module configuration in which each sense module also senses the INV signal of its neighbors.

FIG. 9 illustrates a sense module configuration in which each sense module also senses the INV signal of its neighbors. The bit line 36-0 is flanked by the bit lines 36-1 and 36-1' respectively. The sense module 380-0 is coupled to the bit line 36-0 and the sense modules 380-1 and 380-1' are respectively coupled to the bit line 36-1 and 36-1'. Since each sense module receives the INV signals from its adjacent neighbors, the sense module 380-0 receives the INV signal from the sense module 380-1 and 380-1' respectively as input signals $INV_L$ and $INV_R$. Similarly the INV signal of the sense module 380-0 is input to the sense modules 380-1 and 380-1'.

Referring to FIG. 8 again, according to a preferred embodiment, the bit line bias is supplied by a bit line voltage compensator 560. It senses the mode from its left and right neighbors in the form of the signals $INV_L$ and $INV_R$ respectively and responsively supplies a bias voltage $\Delta V_{BL}$ according to the bias voltage table of FIG. 11. The bias voltage is supplied to a node 523 that is switchably coupled to the bit line 36. During programming, both the signals BLS and INV are HIGH while the signal GRS is LOW. These enable the bit line 36 access to the bit line voltage compensator 560.

Figure 10:
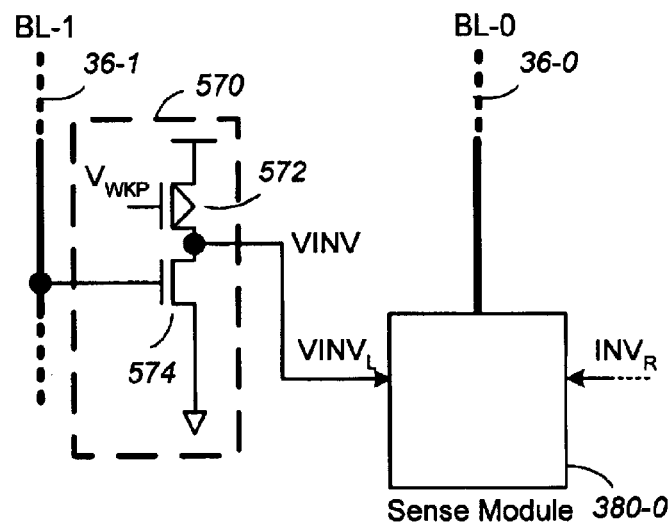
FIG. 10 illustrates an alternative implementation in which the signal indicating whether a neighbor is in program or program-inhibit mode is derived directly from the state of the neighbor's bit line.

FIG. 10 illustrates an alternative implementation in which the signal indicating whether a neighbor is in program or program-inhibit mode is derived directly from the state of the neighbor's bit line. This scheme is useful when the signal is not readily available from a neighboring sense module. As described earlier, when a NAND chain is in program mode, its bit line voltage is kept around ground potential and when it is in program inhibit mode, its bit line voltage is kept at $V_{DD}$.

A virtual INV signal generator 570 senses the bit line voltage and outputs a virtual INV signal, VINV, which is logically equivalent to the INV signal generated by a sense module. The virtual INV signal generator 570 comprises a p-transistor 572 in series with an n-transistor 574 in a pull up/down configuration for the node that outputs the signal VINV. The p-transistor 572 is weakly pulled up by a voltage $V_{WKP}$ at its gate. The voltage of the bit line 36' is input to the gate of the n-transistor 574. The virtual INV signal generator 570 essentially behaves like a tri-state inverter that outputs a HIGH VINV signal when the bit line 36-1 has a voltage close to ground (program mode) and outputs a LOW VINV signal when the voltage is at $V_{DD}$ (program inhibit mode.)

In the example shown in FIG. 10, the VINV signal is input as the signal $VINV_L$ to the neighboring sense module 380-0. Thus, using either the signal INV or VINV, information about the programming or program inhibiting state is communicated to the sense module 380-0 coupled to a NAND chain. In the case when both of its neighboring NAND Chains are in a program mode, the sense module 380-0 pulls down the bit line to ground by way of the bit line pull-down circuit 560.

FIG. 11 is a bias voltage table listing the offset voltage applied to the bit line of a programming storage unit as a function of the program-inhibit modes of its left and right neighbors. The center column lists the offset or bias voltage applied to the bit line of the storage unit under programming as a function of the modes of its left and right neighbors. Generally, the more of its neighbors are in program inhibit mode, the more bit line bias is required to offset the perturbation effect.

Figure 12:
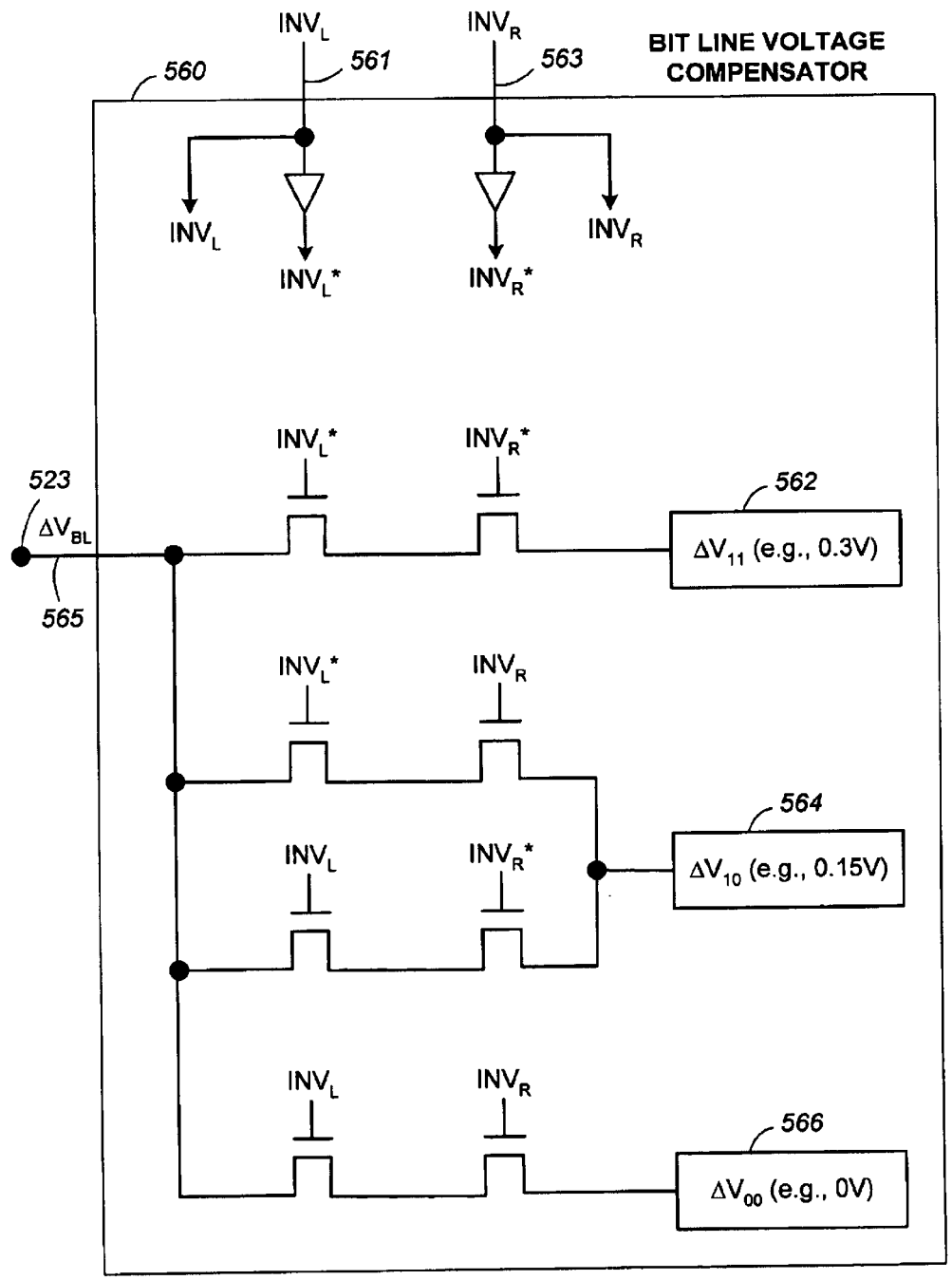
FIG. 12 is a more detailed schematic illustration of the bit line voltage compensator shown in FIG. 8, according to a preferred embodiment of the invention.

FIG. 12 is a more detailed schematic illustration of the bit line voltage compensator shown in FIG. 8, according to a preferred embodiment of the invention. Essentially, the bit line voltage compensator 560 is responsive to the signals $INV_L$ and $INV_R$ at inputs 561 and 563 respectively and outputs a bias voltage $\Delta V_{BL}$ at output 565 to the node 523 of the sense module 380 (see FIG. 8.) In order to supply the bias voltage listed in the table of FIG. 11, three voltage sources 562, 564, 566 respectively supplies $\Delta V_{00}$ (e.g., 0V), $\Delta V_{10}$ (e.g., 0.15V), and $\Delta V_{11}$ (e.g., 0.3V.) Each of these voltage sources is selectively made available at the output 523 via a pair of logic switches controlled by the state of the input signals $INV_L$ and $INV_R$.

Figure 13:
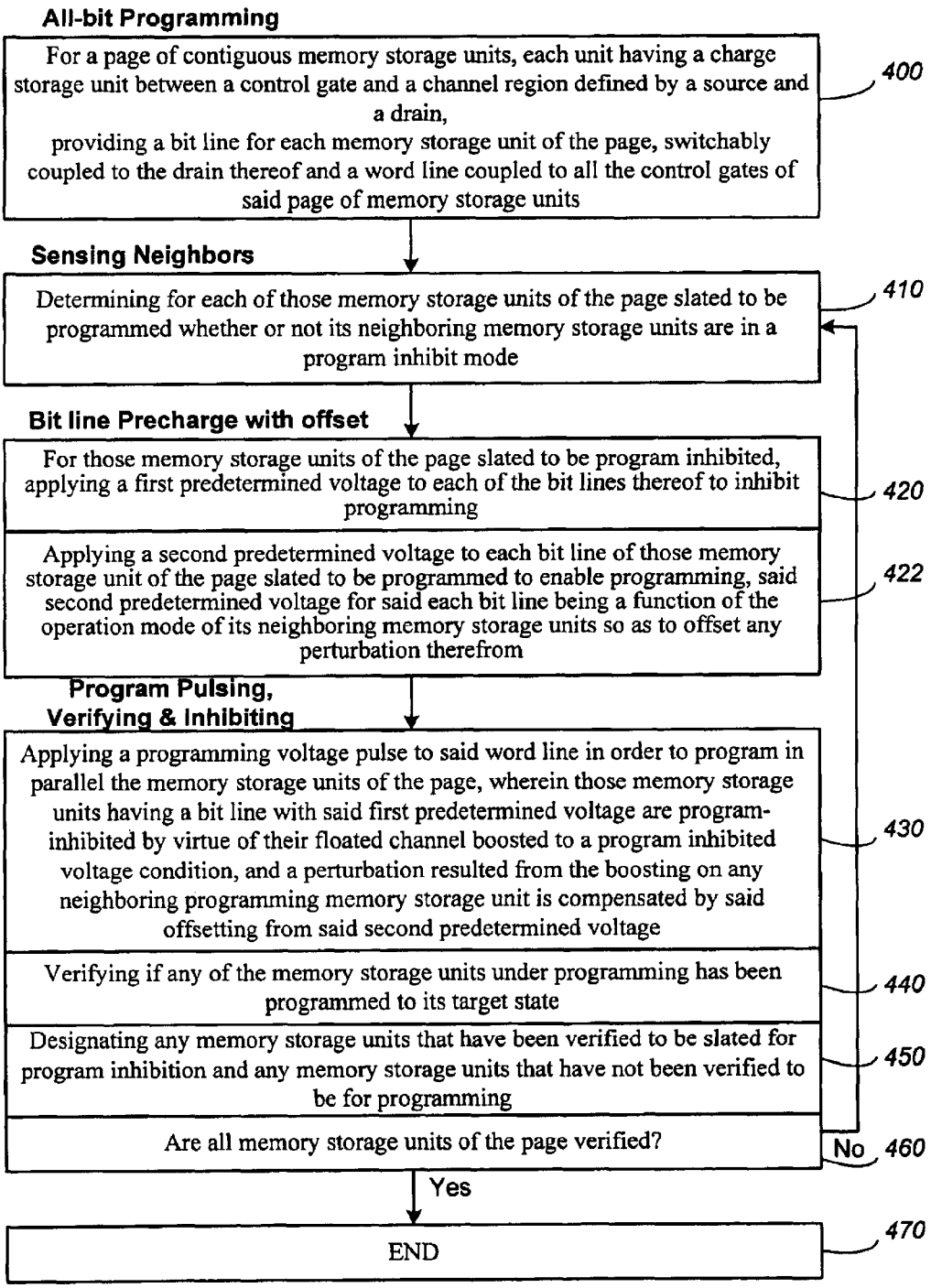
FIG. 13 is a flow diagram showing a method of programming a page of contiguous memory storage units while minimizing the coupling errors due to individual memory transistors among them being program inhibited or locked out, according to one preferred embodiment.

FIG. 13 is a flow diagram showing a method of programming a page of contiguous memory storage units while minimizing the coupling errors due to individual memory transistors among them being program inhibited or locked out, according to one preferred embodiment.

All-bit Programming

STEP 400: For a page of contiguous memory storage units, each unit having a charge storage unit between a control gate and a channel region defined by a source and a drain, providing a bit line for each memory storage unit of the page, switchably coupled to the drain thereof and a word line coupled to all the control gates of said page of memory storage units.

Sensing the Operation Mode of its Neighbors

STEP 410: Determining for each of those memory storage units of the page slated to be programmed whether or not its neighboring memory storage units are in a program inhibit mode.

Bit Line Precharge with Offset

STEP 420: For those memory storage units of the page slated to be program inhibited, applying a first predetermined voltage to each of the bit lines thereof to inhibit programming.

STEP 422: Applying a second predetermined voltage to each bit line of those memory storage unit of the page slated to be programmed to enable programming, said second predetermined voltage for said each bit line being a function of the operation mode of its neighboring memory storage units so as to offset any perturbation therefrom.

Program Pulsing, Verifying & Inhibiting

STEP 430: Applying a programming voltage pulse to said word line in order to program in parallel the memory storage units of the page, wherein those memory storage units having a bit line with said first predetermined voltage are program-inhibited by virtue of their floated channel boosted to a program inhibited voltage condition, and a perturbation resulted from the boosting on any neighboring programming memory storage unit is compensated by said offsetting from said second predetermined voltage.

STEP 440: Verifying if any of the memory storage units under programming has been programmed to its target state.

STEP 450: Designating any memory storage units that have been verified to be slated for program inhibition and any memory storage units that have not been verified to be for programming.

STEP 460: Are all memory storage units of the page verified? If not, return to STEP 420. If so, proceed to STEP 480.

STEP 470: End.

FIGS. 14(A)–14(G) are timing diagrams illustrating the voltage compensation scheme during program operations, according to a first embodiment of the invention.

The voltages shown are applied to various word lines and bit lines of the memory array, for NAND chains under programming and program inhibition (see also FIG. 2 and FIG. 3). The program operation can be grouped into a Bit Lines Precharge Phase, a Program Phase and a Discharge Phase.

Figure 14:
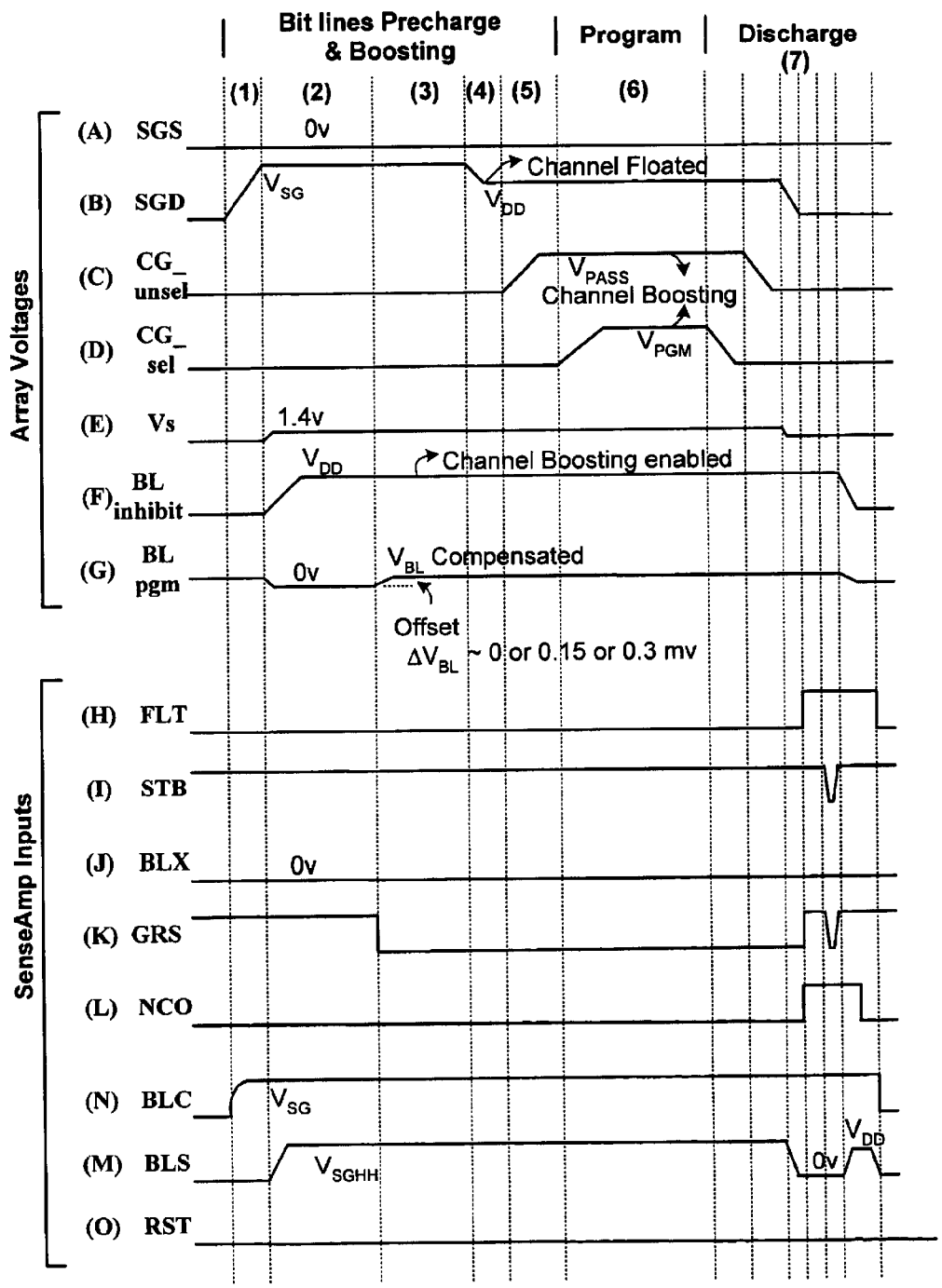
FIGS. 14(A)–14(G) are timing diagrams illustrating the voltage compensation scheme during program operations, according to a first embodiment of the invention.
FIGS. 14(H)–14(O) illustrates the timing of the preferred sense module shown in FIG. 8 in relation to the features of the present invention.

In the Bit Lines Precharge Phase:

(1) The source select transistor is turned off by SGS at 0V (FIG. 14(A)) while the drain select transistor is turned on by SGD going high to $V_{SG}$ (FIG. 14(B)), thereby allowing a bit line to access a NAND chain.

(2) The bit line voltage of a program inhibited NAND chain is allowed to rise to a predetermined voltage given by $V_{DD}$ (FIG. 14(F)). When the bit line voltage of the program inhibited NAND chain rises to $V_{DD}$, the program inhibited NAND chain will float when the gate voltage SGD on the drain select transistor drops to $V_{DD}$. At the same time, the bit line voltage of a programming NAND chain is actively pulled down to 0V (FIG. 14(G)).

(3) The bit line voltage of the programming NAND chain is biased with $\Delta V_{BL}$ supplied by the bit line voltage compensator 560 (FIG. 14(G)). The value of $\Delta V_{BL}$ output from the voltage compensator 560 depends on whether one or both of its neighbors is in program inhibit mode or not.

(4) The drain word line connecting to the drain select transistors of a row of NAND chains has its voltage drop to $V_{DD}$. This will only float those program inhibited NAND chains where their bit line voltage is comparable to $V_{DD}$, since their drain select transistors are turned off (FIGS. 14(B) & 14(F)). As for the NAND chains containing a memory transistor to be programmed, their drain select transistors will not be turned off relative to the bit line voltage of near 0V at their drain.

(5) The memory transistors in a NAND chain not being addressed have their control gate voltage set to $V_{PASS}$ to fully turn them on (FIG. 14(C)). Since a program inhibited NAND chain is floating, the high $V_{PASS}$ and $V_{PGM}$ applied to the unaddressed memory transistors boost up the voltages at their channels and charge storage elements, thereby inhibiting programming. $V_{PASS}$ is typically set to some intermediate voltage (e.g. ~10V) relative to $V_{PGM}$ (e.g. ~15–24V). For a chain being program inhibited, $V_{PASS}$ helps to reduce the effective $V_{DS}$ for the cell subjected to the higher voltage $V_{PGM}$, thereby helping to reduce leakage. For a chain being programmed, $V_{PASS}$ should ideally be at ground potential, thus an intermediate $V_{PASS}$ voltage would be a reasonable compromise.

In the Program Phase:

(6) Programming voltage is applied to the control gate of a memory transistor selected for programming (FIG. 14(D)). The storage units under program inhibition (i.e., with boosted channels and charge storage units) will not be programmed. The storage units under programming will be programmed with a biased bit line voltage (FIG. 14(G) to offset any perturbation due to one or both of its neighbors being in program inhibit mode.

In the Discharge Phase:

(7) The various control lines and bit lines are allowed to discharge.

Basically, the perturbation on a programming storage unit is due to an adjacent storage unit having a floated channel and charge storage unit capacitively boosted by a high control gate voltage from a word line. This occurs when a NAND chain is put into program inhibit mode. This also has the undesirable effect of perturbing (increasing) the voltage on a charge storage unit of the memory transistor to be programmed. By sensing what its neighbors are doing during programming of a storage unit the perturbations of its neighbors are compensated accordingly with an appropriate bit line voltage bias.

Although the various aspects of the present invention have been described with respect to certain embodiments, it is understood that the invention is entitled to protection within the full scope of the appended claims.

What is claimed is:

1. In a non-volatile memory having an array of memory storage units, each unit having a charge storage unit between a control gate and a channel region defined by a source and a drain, and a bit line switchably coupled to the drain, a method of programming in parallel a page of memory storage units having a common word line interconnecting their control gates, comprising:

(a) providing a bit line for each memory storage unit of the page, switchably coupled to the drain thereof;

(b) determining for each of those memory storage units of the page slated to be programmed whether or not its neighboring memory storage units are in a program inhibit mode;

(c) for those memory storage units of the page slated to be program inhibited, applying a first predetermined voltage to each of the bit lines thereof to inhibit programming;

(d) applying a second predetermined voltage to each bit line of those memory storage unit of the page slated to be programmed to enable programming, said second predetermined voltage for said each bit line being a function of the operation mode of its neighboring memory storage units so as to offset any perturbation therefrom; and (e) applying a programming voltage pulse to said word line in order to program in parallel the memory storage units of the page, wherein those memory storage units having a bit line with said first predetermined voltage are program-inhibited by virtue of their floated channel boosted to a program inhibited voltage condition, and a perturbation resulted from the boosting on any neighboring programming memory storage unit is compensated by said offsetting from said second predetermined voltage.

2. The method as in claim 1, further comprising:

(f) verifying if any of the memory storage units under programming has been programmed to its target state;

(g) designating any memory storage units that have been verified to be slated for program inhibition and any memory storage units that have not been verified to be for programming; and (h) repeating (c) to (g) until all of said page of memory storage units have been verified.

3. The method as in any one of claim 1 or 2, wherein the operation mode of at least one of the neighboring memory storage units is derivable from a sense module coupled thereto.

4. The method as in any one of claim 1 or 2, wherein the operation mode of at least one of the neighboring memory storage units is derivable from a voltage of the bit line coupled thereto.

5. The method as in any one of claim 1 or 2, wherein said page of memory storage units forms a contiguous row of said array.

6. The method as in any one of claim 1 or 2, wherein said page of memory storage units forms a contiguous segment of a row of said array.

7. The method as in any one of claim 1 or 2, wherein:
said memory is organized as an array of NAND chains of memory storage units, each chain having a plurality of memory storage units connected in series, and said page of memory storage units is constituted from a memory storage unit from each NAND chain among a page thereof.

8. The method as in any one of claim 1 or 2, wherein each memory storage unit stores one bit of information.

9. The method as in any one of claim 1 or 2, wherein each memory storage unit stores more than one bit of information.

10. The method as in any one of claim 1 or 2, wherein said charge storage unit is a floating gate.

11. The method as in any one of claim 1 or 2, wherein said charge storage unit is a dielectric layer.

12. The method as in any one of claim 1 or 2, wherein said non-volatile memory is in the form of a memory card.

13. A non-volatile memory comprising:
an array of memory storage unit arranged in rows and columns;
each memory storage unit having a charge storage unit, a control gate and a channel region defined by a source and a drain;
a word line interconnecting the control gates of a page of memory storage units;
a bit line for each memory storage unit of said page, said bit line switchably coupled to the drain thereof;
a precharging circuit coupled to said bit line,
said precharging circuit supplying a predetermined program inhibiting voltage to said bit line when the associated memory storage unit is slated for program inhibition and supplying a predetermined program enabling voltage said bit line when the associated memory storage unit is slated for programming, and
said predetermined program enabling voltage having a predetermined offset that is a function of whether or not none, one, or both of neighboring memory storage units are in a program inhibit mode.

14. A non-volatile memory as in claim 13, further comprising:
individual sense modules associated with said neighboring memory storage units and wherein a signal from each said individual sense module indicates whether the associated neighboring memory storage is in a program inhibit mode or not.

15. A non-volatile memory as in claim 13, further comprising:
individual bit line voltage detectors associated with said neighboring memory storage units and wherein a signal from each said individual bit line voltage detector indicates whether the associated neighboring memory storage is in a program inhibit mode or not.

16. A non-volatile memory, comprising:
an array of memory storage units, each unit having a charge storage unit between a control gate and a channel region defined by a source and a drain;
a word line interconnecting the control gates of a page of memory storage units of said array;
a bit line for each memory storage unit of the page, switchably coupled to the drain thereof;
means for applying a first predetermined voltage to inhibit programming to each of the bit lines of those memory storage units of the page slated to be program inhibited;
means for determining for each of those memory storage units of the page slated to be programmed whether or not its neighboring memory storage units are in a program inhibit mode;
means for applying a second predetermined voltage to each bit line of those memory storage unit of the page slated to be programmed to enable programming, said second predetermined voltage for said each bit line being a function of the operation mode of its neighboring memory storage units so as to offset any perturbation therefrom; and
means for applying a programming voltage pulse to said word line in order to program in parallel the memory storage units of the page, wherein those memory storage units having a bit line with said first predetermined voltage are program-inhibited by virtue of their floated channel boosted to a program inhibited voltage condition, and a perturbation resulted from the boosting on any neighboring programming memory storage unit is compensated by said offsetting from said second predetermined voltage.

17. The non-volatile memory as anyone of claims 13–15, wherein said page of memory storage units forms a row of said array.

18. The non-volatile memory as in anyone of claims 13–15, wherein said page of memory storage units forms a segment of a row of said array.

19. The non-volatile memory as in anyone of claims 13–15, wherein:
said memory is organized as an array of NAND chains of memory storage units, each chain having a plurality of memory storage units connected in series, and said page of memory storage units is constituted from a memory storage unit from each NAND chain among a page thereof.

20. The non-volatile memory as in anyone of claims 13–15, wherein each memory storage unit stores one bit of information.

21. The non-volatile memory as in anyone of claims 13–15, wherein each memory storage unit stores more than one bit of information.

22. The non-volatile memory as in anyone of claims 13–15, wherein said charge storage unit is a floating gate.

23. The non-volatile memory as in anyone of claims 13–15, wherein said charge storage unit is a dielectric layer.

24. The non-volatile memory as in anyone of claims 13–15, wherein said non-volatile memory is in the form of a card.

25. A non-volatile memory, comprising:
an array of memory storage units;
a group of memory storage units among said array, each memory storage unit of the group having a bit line coupled thereto;
a circuit for operating on said group of memory storage units in parallel while individual memory storage units of the group exist in one of a predetermined set of operation modes; and
said circuit further comprising a voltage supply for supplying selected one of a predetermined set of voltages to each bit line; said selected voltage being a function of the operation modes of neighboring memory storage units.

* * * * *